United States Patent
Gradinger et al.

(10) Patent No.: US 12,199,013 B2
(45) Date of Patent: Jan. 14, 2025

(54) ARRANGEMENT COMPRISING A BASEPLATE FOR A POWER SEMICONDUCTOR MODULE AND A COOLER

(71) Applicant: Hitachi Energy Ltd, Zürich (CH)

(72) Inventors: Thomas Gradinger, Aarau Rohr (CH); Milad Maleki, Untersiggenthal (CH); Daniele Torresin, Baden (CH)

(73) Assignee: Hitachi Energy Ltd, Zürich (CH)

( * ) Notice: Subject to any disclaimer, the term of this patent is extended or adjusted under 35 U.S.C. 154(b) by 329 days.

(21) Appl. No.: 17/629,904

(22) PCT Filed: Jul. 24, 2020

(86) PCT No.: PCT/EP2020/070989
§ 371 (c)(1),
(2) Date: Jan. 25, 2022

(87) PCT Pub. No.: WO2021/014000
PCT Pub. Date: Jan. 28, 2021

(65) Prior Publication Data
US 2022/0262707 A1    Aug. 18, 2022

(30) Foreign Application Priority Data
Jul. 25, 2019    (EP) .................... 19188338

(51) Int. Cl.
*H01L 23/473*    (2006.01)
(52) U.S. Cl.
CPC ................. *H01L 23/473* (2013.01)

(58) Field of Classification Search
CPC combination set(s) only.
See application file for complete search history.

(56) References Cited

U.S. PATENT DOCUMENTS

| | | |
|---|---|---|
| 5,978,220 A | 11/1999 | Frey et al. |
| 2003/0227732 A1 | 12/2003 | Dessiatoun et al. |
| 2012/0139096 A1* | 6/2012 | Gohara ............... H01L 23/3735 |
| | | 257/E23.101 |
| 2014/0239486 A1 | 8/2014 | Gohara et al. |

(Continued)

FOREIGN PATENT DOCUMENTS

| | | |
|---|---|---|
| CN | 1180990 A | 5/1998 |
| CN | 102549743 A | 7/2012 |

(Continued)

*Primary Examiner* — Mohammad A Rahman
(74) *Attorney, Agent, or Firm* — Slater Matsil, LLP (57) ABSTRACT

An apparatus includes a baseplate and a cooler providing a cooling channel adapted for providing a coolant flow. An electronic circuit includes a power semiconductor device disposed at the first side of baseplate. A footprint of the power semiconductor device defines a device area on the first side. A cooling area at the second side of the baseplate opposite the device area is adapted for dissipating heat from the baseplate by bringing the cooling area into thermal contact with the coolant flow in the cooling channel. An auxiliary area is located on the second side of the baseplate adjacent to the cooling area. The auxiliary area includes a flow guide for reducing a flow rate of the coolant flow in the auxiliary area and the cooling channel is adapted to receive the cooling area and the flow guide.

20 Claims, 2 Drawing Sheets

(56) References Cited

U.S. PATENT DOCUMENTS

2016/0343640 A1 11/2016 Gohara et al.
2017/0287809 A1 10/2017 Schultz

FOREIGN PATENT DOCUMENTS

| CN | 103858224 A | 6/2014 |
| CN | 104779226 A | 7/2015 |
| DE | 102012202708 A1 | 8/2013 |
| EP | 3032580 A1 | 6/2016 |
| JP | 2016225339 A | 12/2016 |
| WO | 2011018882 A1 | 2/2011 |
| WO | 2016021565 A1 | 2/2016 |

* cited by examiner

ARRANGEMENT COMPRISING A BASEPLATE FOR A POWER SEMICONDUCTOR MODULE AND A COOLER

CROSS-REFERENCE TO RELATED APPLICATIONS

This application is a national stage application of International Application No. PCT/EP2020/070989, filed on Jul. 24, 2020, which claims priority to European Patent Application No. 19188338.8, filed on Jul. 25, 2019, which applications are hereby incorporated herein by reference.

TECHNICAL FIELD

The present invention relates to an arrangement comprising a baseplate for a power semiconductor module and a cooler.

BACKGROUND

Power semiconductor modules are generally widely known in the art. The power semiconductor devices of the power semiconductor module produce heat that needs to be dissipated in order to maintain the functionality of the power semiconductor module. There are different cooling techniques in order to dissipate heat away from the baseplate of the power semiconductor modules, such as bringing a cooling structure that is integrated in the baseplate into direct contact with a coolant flow of a liquid coolant. The coolant flow can be provided in a cooling channel of a cooler.

A preferred way of cooling is using pin fins as a cooling structure. US 2017/02877809 describes a pin fin heat sink, wherein a plurality of pins extends from the baseplate and is formed integral with the baseplate by forging. The pin field defines a rectangular area that has 25 mm long sides.

U.S. Pat. No. 5,978,220 A describes that in a liquid cooling device for a high-power semiconductor module, which contains a plurality of heat-generating submodules arranged next to one another on a cooling surface and is fusion-bonded to the cooling surface, an improved load cycle resistance is achieved by the liquid cooling device. The liquid cooling device has a housing which encloses a liquid space, through which a cooling liquid flows, and the upper side of which forms the cooling surface, and by the housing of the liquid cooling device, at least in the region of the cooling surface, consisting of a metal-ceramic composite material, the coefficient of thermal expansion of which is adapted to the coefficient of thermal expansion of the ceramic substrates or of the power semiconductor devices of the submodules and, by additional means for improving the heat transfer between the cooling surface and the cooling liquid being provided in the liquid space of the liquid cooling device.

US 2003/227732 A1 describes that a heat transfer structure includes a heat transfer module having a plurality of heat transfer members in the duct chamber with the density increased in the direction of the flow of the coolant and having a greatest density adjacent to the position of a heat source attached in thermal contact with the heat transfer module. The profile of the duct chamber is adjusted to the position of the heat source to increase the velocity of coolant directly under the heat source and to partially or completely block the coolant flow to the areas which do not need to be temperature adjusted. The heat transfer members may be formed as pin fins fabricated from springs compressed to a predetermined density in a direction perpendicular to the longitudinal axis of the spring and/or in parallel to the longitudinal axis of the heat transfer module.

However, the prior art such as according to the above cited reference still gives room for improvements especially regarding an efficient cooling of the power semiconductor module.

SUMMARY

Embodiments of the invention provide a solution for overcoming at least one disadvantage of the prior art at least in part. Particular embodiments of the present invention provide a solution for homogenously and effectively cooling one or more power semiconductor devices on the baseplate.

In one embodiment, an arrangement comprises a baseplate for a power semiconductor module and a cooler. The cooler provides a cooling channel adapted for providing a coolant flow. The baseplate comprises a first side adapted for carrying an electronic circuit that comprises at least one power semiconductor device. At least one power semiconductor device forms at least one device area on the first side. The device area is the footprint of the power semiconductor device. The baseplate further comprises a second side located opposite the first side. The baseplate comprises on the second side at least one cooling area opposite to at least one device area. The at least one cooling area is adapted for dissipating heat from the baseplate by bringing the cooling area into contact with the coolant flow in the cooling channel. The baseplate on the second side additionally comprises an auxiliary area located adjacent to the cooling area. The auxiliary area comprises a flow guide for reducing a flow rate of the coolant flow in the auxiliary area and the cooling channel is adapted for receiving the at least one cooling area and the at least one flow guide.

Additional embodiments are provided in the description as well as in the figures. The described embodiments can, alone or in any combination of the respective embodiments, provide a feature of the present invention unless not clearly excluded.

BRIEF DESCRIPTION OF THE DRAWINGS

These and other aspects of the invention will be apparent from and elucidated with reference to the embodiments described hereinafter. Individual features disclosed in the embodiments can constitute alone or in combination an aspect of the present invention. Features of the different embodiments can be carried over from one embodiment to another embodiment.

In the drawings.

DETAILED DESCRIPTION OF ILLUSTRATIVE EMBODIMENTS

Embodiments and aspects will be described followed by examples discussed with respect to the figures.

A first embodiment includes an arrangement comprising a baseplate for a power semiconductor module and a cooler. The cooler provides a cooling channel adapted for providing a coolant flow. The baseplate comprises a first side adapted for carrying an electronic circuit that comprises at least one power semiconductor device. At least one power semiconductor device forms at least one device area on the first side, the device area being the footprint of the power semiconductor device. The baseplate further comprises a second side located opposite the first side. The baseplate comprises on the second side at least one cooling area opposite to at least one device area. The at least one cooling area is adapted for dissipating heat from the baseplate by bringing the cooling area into contact with the coolant flow in the cooling channel. The baseplate on the second side additionally comprises an auxiliary area located adjacent to the cooling area. The auxiliary area comprises a flow guide for reducing a flow rate of the coolant flow in the auxiliary area and wherein the cooling channel is adapted for receiving the at least one cooling area and the at least one flow guide.

Such an arrangement provides significant advantages over solutions of the prior art, especially with regard to effective and/or homogenous cooling of the power semiconductor device.

The present invention thus refers to an arrangement comprising a baseplate and a cooler, the baseplate having a flow guide. The baseplate can be used with different arrangements of the power semiconductor devices on the baseplate in the course of producing a power semiconductor module.

The baseplate of the present invention has a first side that is adapted for carrying and particularly carries the electronic circuit that comprises at least one power semiconductor device. The power semiconductor device may have functionalities as known in the art. For reliably performing its functionalities, the power semiconductor device needs to be cooled, i.e., the heat produced by the power semiconductor device needs to be dissipated from the power semiconductor device.

The power semiconductor device forms a device area on the first side of the baseplate. In the sense of the present invention, forming a device area means that the position, size, dimension, geometry and/or arrangement of the power semiconductor device or the power semiconductor devices on the first side of the baseplate defines the position, size, dimension, geometry and/or arrangement of the device area or device areas on the first side of the baseplate, respectively. Hence, the area on the baseplate on which the power semiconductor device is placed and thus the contact area of the power semiconductor device and the baseplate corresponds to the device area. In other words, the device area may be the footprint of the power semiconductor device on the first side of the baseplate.

It is possible that the baseplate is adapted for carrying one power semiconductor device on the first side of the baseplate. In this case, there may also be one device area.

It is also possible that the baseplate is adapted for carrying more than one power semiconductor device on the first side of the baseplate. For example, the baseplate may be adapted for carrying two, three, four, or even more than four power semiconductor devices on the first side. In this case there may also be two, three, four, or even more device areas. Thus, in this case, every power semiconductor device defines one device area.

The layout with which the power semiconductor devices are arranged on the first side of the baseplate may be arbitrary. Alternatively, the layout may be chosen in order to enhance the functionality of the power semiconductor module, e.g., the layout may be chosen in order to reduce stray inductances, or in order to be able to fully exploit high switching frequencies of the power semiconductor device.

The second side of the baseplate is located opposite to the first side of the baseplate. The second side of the baseplate may be parallel to the first side of the baseplate. For example, the first side of the baseplate may be the upper side and the second side of the baseplate may be the lower side.

The second side of the baseplate comprises at least one cooling area opposite to at least one device area on the first side. The cooling area is adapted for dissipating heat from the baseplate by bringing the cooling area into contact with the coolant flow in the cooling channel, wherein the cooling channel is provided by the cooler. Therefore, the heat produced by the one or more power semiconductor devices on the first side may be dissipated from the baseplate and thus from the one or more power semiconductor devices into the coolant. The coolant flow in the cooling channel has a certain flow rate which may influence the heat dissipation from the baseplate. The coolant in the cooling channel may be a liquid coolant, a gaseous coolant or a supercritical coolant. Preferably, the coolant is a liquid coolant, more preferably the coolant is a mixture of water and glycol.

In order to efficiently cool the power semiconductor device or the power semiconductor devices, the position of at least one cooling area may essentially correspond to the position of at least one device area. The cooling area may not only be opposite to the device area but essentially may also correspond in its position to the position of the device area. Furthermore, the size of the cooling area may be in the range of 100% to 500% with regard to the size of the device area and thus a size of at least one cooling area corresponds to a size of at least one device area.

There may be some heat spreading in the baseplate. In particular, the heat injected by the power semiconductor device on the first side of the baseplate may spread over an area on the second side of the baseplate that is larger than the device area. Therefore, for good cooling efficiency, it may be advantageous to have the cooling area larger than the device area. Preferably, the cooling area extends over the device area in a symmetrical fashion. In other words, the device area and the cooling area may be similar in a geometrical sense, since they both have the same shape. More preferably, the cooling area may be obtained from the device area by uniformly scaling. It may also be provided that priority of a symmetric arrangement of the cooling area with respect to the device area is higher compared to a priority of the size of the cooling area.

The second side of the baseplate additionally comprises the auxiliary area adjacent to the cooling area and thus particularly different from the device area. In particular, adjacent to the cooling area shall mean in a plane of the second side next to the cooling area. In case there are several cooling areas there may be an auxiliary area adjacent to every cooling area. Alternatively, there may be an auxiliary area adjacent to only some cooling areas, or there may be an auxiliary area adjacent to only one cooling area. The auxiliary area comprises the flow guide for reducing the flow rate of the coolant flow at the auxiliary area. Since the auxiliary area is adjacent to the cooling area on the second side and since the cooling area is opposite to the device area, an area on the first side of the baseplate that is opposite to the auxiliary area may not be part of the device area. Therefore, the baseplate may not carry a power semiconductor device on the first side of the baseplate, opposite to the auxiliary area. Cooling of the auxiliary area with the same cooling rate as the cooling area would thus be contra productive to a homogenous cooling of the power semiconductor devices. Thus, by reducing the flow rate of the coolant flow at the auxiliary area with the flow guide, a homogenous cooling of the power semiconductor devices can be achieved.

The flow guide may be a mechanical part that is adapted to reduce the rate of the coolant flow at the auxiliary area. The flow rate may be reduced by preventing a high flow rate at the auxiliary area or by displacing the coolant at the auxiliary area. In other words, the auxiliary area may comprise the flow guide for reducing the flow rate of the coolant flow that would bypass the cooling area. Since the flow rate at the auxiliary area is reduced, heat dissipation from the auxiliary area is also reduced. But since the baseplate may not carry a power semiconductor device on the first side of the baseplate opposite to the auxiliary area a reduced heat dissipation in this area does not adversely affect the functionality of the power semiconductor module. On the contrary, since cooling capacity of the coolant is not wasted for areas that do not need cooling, all cooling capacity can be used for the areas that need cooling, i.e., the cooling areas opposite to the device areas. Cooling capacity may also be used for any other areas which needs better cooling than the auxiliary area.

Therefore, by using the flow guide the cooling areas are cooled more effectively and the heat dissipation from the power semiconductor devices is enhanced. This in turn may lead to a more reliable functionality of the power semiconductor device and even to an enhanced lifetime of the power semiconductor device.

With respect to an efficient cooling of the cooling area, a baseplate may be provided, wherein the cooling area comprises a cooling structure, wherein the cooling structure is adapted for being placed in the cooling channel and being flown through by the coolant flow. An especially efficient heat transfer may be achieved by increasing the surface of the cooling area that is in contact with the coolant flow especially compared to a flat surface. Therefore, by using a cooling structure that can be flown through by the coolant, an especially high heat dissipation can be accomplished.

In this regard, it may be preferred that a cooling structure comprises a plurality of cooling pins. Preferably, the coolant is in direct contact with the cooling pins of the cooling structure. The cooling pins may protrude in a perpendicular manner from the second side of the baseplate. The coolant may flow in between the cooling pins. Therefore, the cooling pins provide a high surface for heat transfer to the coolant and thus are an especially efficient way for heat dissipation. The cooling pins may have different cross-sections. For example, the cross-sections may be circular, ellipsoidal or rhomboidal.

For example, the pins of the cooling structure are most efficient when allocated underneath the heat sources, for example underneath the power semiconductor devices. Pins allocated further away from the power semiconductor devices contribute to a much lesser extent to cooling the power semiconductor devices while fully contributing to a pressure drop of the coolant flow. Therefore, the pin field, as cooling structure, advantageously extends approximately over the same area as the cooling area.

However, the layout of the power semiconductor device on the baseplate and therefore the area that needs cooling may vary. For example, the layout of the power semiconductor device may be interleaved to minimize stray inductances and to be able to fully exploit high frequency switching. The layout may also vary due to different suppliers of the power semiconductor device.

Even with different layouts of the power semiconductor device on the baseplate, it is attractive to keep the interfaces to the cooler the same, in order to reduce the number of different parts needed for manufacturing the power semiconductor module. This is possible without problems according to the present invention especially compared to the prior art.

A possibility according to the prior art to keep the interface to the cooler independent of the layout of the power semiconductor device is to keep the area of the pin field as cooling structure constant for all different layouts. To avoid any uncooled power semiconductor device, the pin field needs to extend over an area that covers all different layouts. Therefore, for some layouts there are pins that are allocated far away from the power semiconductor devices.

However, pins allocated far away from the power semiconductor devices contribute to a much lesser extent to cooling the power semiconductor devices. However, if the pins allocated far away from the power semiconductor device are fluidly series-connected with the other pins they fully contribute to pressure drop of the coolant flow. The pins allocated far away from the power semiconductor devices consume part of the coolant flow, therefore the flow rate available to cool the pins allocated beneath the heat source is reduced. Hence the overall cooling performance is reduced. Furthermore, the cooling rate for the different power semiconductor devices is not equal, since some power semiconductor devices are surrounded by more pins than others. This inhomogeneous cooling may lead to different temperatures of the power semiconductor devices, which in turn affects the electrical properties of the power semiconductor devices. Inhomogeneous cooling may even lead to an unequal current distribution.

Without changing the geometry of the cooling channel, it is ill-conceived to omit the pins that are allocated further away from the power semiconductor devices. By omitting these pins, the pin field would be smaller than the cooling channel and this would lead to a significant bypass flow of the coolant past the remaining pins. This in turn would lead to a reduced cooling efficiency of the power semiconductor devices.

Since according to the invention, preferably the size and particularly the position of the at least one cooling area corresponds to the size and particularly the position of the device area like described above, the above-described disadvantages can be overcome. An area on the first side of the baseplate that is opposite to the auxiliary area is not part of the device area. Therefore, correspondence of the size and position of the cooling area and device area, leads to a highly homogenous cooling of the device area. Furthermore, the interface of such a baseplate to the cooler is independent of the geometries and arrangement of the power semiconductor devices on the baseplate. Therefore, such a baseplate can be used with different arrangements of the power semiconductor devices on the baseplate in the course of producing a power semiconductor module.

As already mentioned, the auxiliary area comprises a flow guide for reducing a flow rate of the coolant flow at the auxiliary area. In general, a reduction of the flow rate at the auxiliary area may be reached with different designs of the flow guide. However, it may be preferred that the flow guide comprises a contour that is arranged corresponding to a contour of the auxiliary area. This has several advantages, since the contour of the auxiliary area has a closed form. As non-binding examples of closed forms, the latter may have the form of an "o" or a rectangular form. Furthermore, the flow guide may have essentially the same size, contour and position as the auxiliary area. Therefore, it only reduces the flow rate of the coolant at the auxiliary area.

According to the above, the flow guide may be formed by a rim. Preferably, the rim protrudes in a perpendicular manner from the second side of the baseplate. More preferably, the flow guide is hollow, meaning that a cavity is provided inside the area enclosed by the rim. This has the advantage that very little material needs to be used for providing the flow guide. Therefore, the additional weight and the cost for introducing the flow guide are also low. Furthermore, the coolant that may be in the cavity of the flow guide has a very slow flow rate up to a flow rate of essentially zero. Hence, the flow guide does essentially not contribute to heat dissipation and a highly homogenous cooling of the device area is achieved. The flow guide may have different forms. Preferably the form of the flow guide is chosen under consideration of the device area and/or the auxiliary area. The form of the flow guide may be essentially rectangular, e.g., it may have the form of a rectangle with rounded corners. It may have a round form, e.g., the form of an oval or an ellipse. Alternatively, the form of the flow guide may be essentially quadrangular, trapezoid, multangular or polygonal. Alternatively, the flow guide may have the form of a "U", or of an "L", or of an "H", i.e., the rim has two or more ends. The different forms of the flow guide may lead to a suppression of the coolant flow through the flow guide, because of which the flow guide may have the function of a flow blocker.

It may further be provided that the flow guide is formed by a massive part. Therefore, the flow guide is not hollow. In the auxiliary area all the coolant is displaced by the massive flow guide. This is especially advantageous in combination with a flow guide made by a light material, which has a low thermal conductivity, e.g., plastic.

The flow guide may comprise an essentially rectangular shaped form, a u-shaped form, or an L-shaped form. A rectangular shaped form may be the form of a rectangle with or without rounded corners or the form of a parallelogram. Since many power semiconductor devices have a rectangular form, it may be advantageous with regard to a homogenous cooling that the flow guide is formed in a rectangular shaped form.

It may further be provided that the flow guide has a u-shaped form. The u-shaped form may be achieved by omitting one side of the rectangular shaped form. A u-shaped form of the flow guide may have the advantages that less material is used for fabrication of the flow guide.

Furthermore, in a yet another embodiment, the flow guide may have an L-shaped form. The L-shaped form may be achieved by omitting two adjacent sides of the rectangular shaped form. An L-shaped form of the flow guide may have the advantages that less material is used for fabrication of the flow guide.

It is possible that the flow guide is fabricated as part of the baseplate in a one part form with the baseplate along with the cooling pins of the cooling structure by forging. In this case the flow guide may be made of the same material as the baseplate. Preferably, the baseplate is made from copper or an alloy thereof, aluminum or an alloy thereof, and/or a metal matrix composite comprising an aluminum matrix with silicon carbide particles (AlSiC). Alternatively, the baseplate may be made from a layered compound of copper and aluminum, a layered compound of alloys of aluminum and/or a layered compound of alloys of copper.

Apart from that, the flow guide may be fixed to a main body of the baseplate by brazing, welding or gluing. For example, the flow guide may be fixed to the main body by brazing. Gluing the flow guide to the baseplate or its main body is also a possibility, in which case different materials for the flow guide and the baseplate may be used. For example, the flow guide can be made out of a plastic. It can be advantageous to use plastic, since plastic is lightweight and has a very low thermal conductivity. Therefore, a flow guide made from a plastic has nearly no effect on heat transfer.

The main body may for example be a main part of the baseplate being formed as a plate and forming a support, e.g., for the flow guide and optionally for the cooling pins.

It may further be preferred that the height of the flow guide corresponds to the height of the cooling structure. For example, the height of the rim of the flow guide can be essentially equal to the height of the cooling pins of the cooling structure. Therefore, the cooling structure and the flow guide immerse by the same depth into the coolant. This may lead to an improved cooling performance of the power semiconductor devices. The same height may comprise that there may be a small deviation regarding the height of the flow guide corresponding to the height of the cooling structure in the range of +/−5% relating to the part having the larger height. Therefore, there may be a small deviation regarding the depth of the immersion in the range of +/−5%.

The cooler provides such as comprises the cooling channel which is adapted for providing the coolant flow. The cooler may be a mechanical part that can be connected to the baseplate and may in this state form a cooling channel. Thus, the cooling channel may be formed by a space of the cooler which is open to one side. The side of the cooler having the open end of the space may be fixed to the base plate in a sealed manner so that the space forms the cooling channel. In the connected form the cooling channel of the cooler may enclose the cooling area and particularly at least in part the auxiliary area of the baseplate. Preferably, the coolant is a liquid coolant, which flows in the cooling channel of the cooler. The cooling channel may have a flat bottom and two side walls that are essentially perpendicular to the bottom, wherein the side walls may be fixed to the baseplate like described above. Preferably the two side walls are essentially parallel to each other. In this case the cross section perpendicular to the coolant flow has essentially the form of a rectangle. Small deviations regarding the parallelism and perpendicularity of the side walls in the range of +/−5% in angular deviation may be possible an included by the present description.

However, the geometry of the cooling channel is not strictly limited. The cooling channel of the cooler is adapted for receiving the cooling area and the at least one flow guide. Therefore, the arrangement is able to effectively and homogenously cool the power semiconductor devices that may be arranged on the first side of the baseplate.

It may be preferred that the auxiliary area and the cooling area together have a width which corresponds to the width of the cooling channel. The shortest distance between the two side walls of the cooling channel defines the width of the cooling channel. In order to reduce bypass flow of the coolant, the width of the cooling channel is essentially equal to the width of the auxiliary area and the cooling area together. Regarding the expression "corresponds", there may be a small deviation between the width of the cooling channel and the collective width of the auxiliary area and the cooling area which may lie in the range of +/−5% referring to the larger value.

Due to this correspondence of the collective width of the cooling area and the auxiliary area such as of the cooling structure and the flow guide on the one side and the width of the cooling channel on the other side, essentially the entirety of the coolant in the cooling channel contributes to cooling the cooling area, and there is no bypass flow around the cooling area. For example, nearly all of the coolant may flow through the cooling structure in the cooling area.

The flow direction of the coolant is perpendicular to the width of the cooling channel. In order to achieve high heat dissipation from the baseplate, an arrangement may be provided wherein the auxiliary area and the cooling area are arranged along the width of the cooling channel. Therefore, the arrangement of the auxiliary area and the cooling area is perpendicular to the flow direction of the coolant flow and the coolant flow may not be obstructed by the flow guide. An arrangement of the auxiliary area and the cooling area perpendicular to the width of the cooling channel and therefore along the flow direction of the coolant flow may lead to an obstruction of the coolant flow by the flow guide and therefore could affect heat dissipation in the cooling area in an adverse fashion.

According to the above, an arrangement may be provided wherein the flow guide comprises a u-shaped form, a rectangular shaped form, or an L-shaped form, and wherein a longer axis of the form of the flow guide is parallel to a flow direction of the coolant flow. For example, an arrangement may be provided wherein the flow guide comprises a u-shaped form, and wherein the legs of the u-shaped form are arranged parallel to the flow direction of the coolant flow. Preferably the opening of the u-shaped form faces in the direction of the coolant flow and is thus at the downstream end of the flow guide. Alternatively, the opening of the u-shaped form faces in the direction contrary to the coolant flow and is thus at the upstream end of the flow guide. It may also be possible that the flow guide comprises an essentially rectangular shaped form wherein a longer axis of the rectangular shaped form is parallel to the flow direction of the coolant flow. Furthermore, it may be possible that the flow guide comprises an L-shaped form, wherein a longer axis of the L-shaped form is parallel to the flow direction of the coolant flow. In case of a different length of the thighs of the L-form, the shorter thigh of the L-shaped form may be at the downstream or at the upstream end of the flow guide.

Again, small deviations regarding the parallelism of longer axis of the form of the flow guide with regard to a flow direction of the coolant flow in the range of +/−5% in angular deviation may be possible an included by the present description.

With regard to an effective cooling an arrangement may be provided wherein the cooling area comprises a cooling structure and wherein the cooling structure and the flow guide are in mechanical contact with a bottom of the cooling channel. As already mentioned, it may be advantageous, if the height of the flow guide corresponds to the height of the cooling structure. In combination with a cooling channel that may have a flat bottom it is even more advantageous, when the flow guide and the cooling structure are in mechanical contact with the bottom of the cooling channel. Therefore, essentially the entirety of the coolant flows through the cooling structure and contributes to cooling the cooling area. In other words, there is no bypass flow of coolant between the cooling structure and the bottom of the cooling channel or between the flow guide and the bottom of the cooling channel. Therefore, a highly effective cooling is achieved.

To summarize the above, the present invention solves an important object how to effectively and/or homogenously cool power semiconductor devices on a baseplate. Embodiments will now be described with respect to the drawings.

Figure 1:
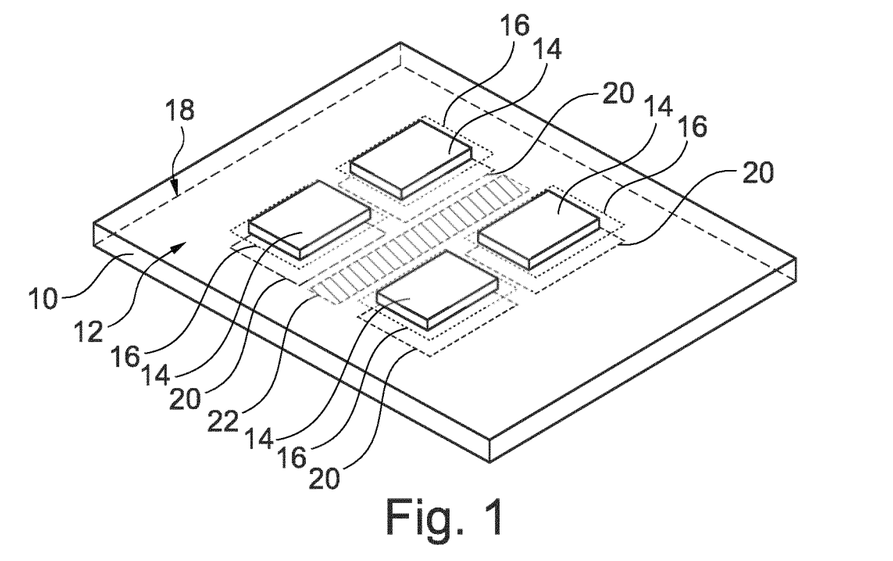
FIG. 1 shows a schematic view of a first side of a baseplate for a power semiconductor module, according to a first embodiment of the invention.

FIG. 1 shows a baseplate 10 for a power semiconductor module, wherein reference sign 10 may particularly is directed to a main body of the baseplate 10. The baseplate 10 comprises a first side 12 which is adapted for carrying an electronic circuit that comprises at least one power semiconductor device 14.

In this first embodiment shown in FIG. 1, the baseplate 10 is adapted for carrying four power semiconductor devices 14. The power semiconductor devices 14 each define a device area 16 on the first side 12 of the baseplate 10. For clarity reasons the device areas 16 are shown slightly larger than actually defined by the devices 14 wherein it should be noted that the device areas 16 are a footprint of the power semiconductor devices 14. The baseplate 10 further comprises a second side 18 opposite to the first side 12. In this embodiment the second side 18 is the lower side of the baseplate 10 and is parallel to the first side 12.

The second side 18 comprises at least one cooling area 20 opposite to at least one device area 16. In this first embodiment, the second side 18 comprises a cooling area 20 opposite to each device area 16. Therefore, the second side 18 comprises four cooling areas 20. The size and position of each cooling area 20 corresponds to the size and the position of each device area 16 and thus of the respective power semiconductor device 14. The second side 18 additionally comprises an auxiliary area 22 located adjacent to the cooling area 20. In this first embodiment there is one auxiliary area 22, which is located in between two cooling areas 20.

Figure 2:
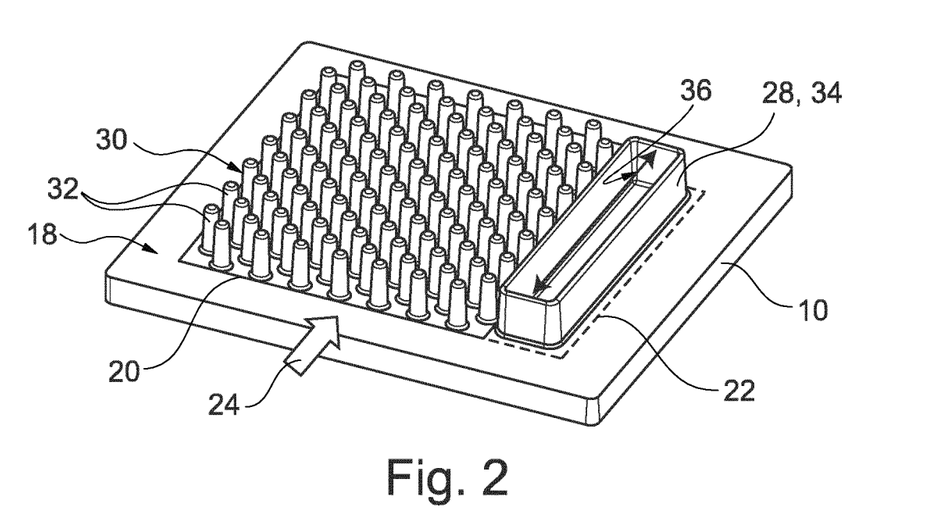
FIG. 2 shows a schematic view of a second side of a baseplate for a power semiconductor module, according to a second embodiment of the invention.

In FIG. 2, a further embodiment of the baseplate 10 is shown, wherein the same or comparable components are defined by the same reference numbers as compared to FIG. 1.

In FIG. 2 the baseplate 10 is shown lying on its first side 12. Therefore, the device area 16 on the first side 12 is not visible in FIG. 2. However, the cooling area 20 on the second side 18 is shown. In this second embodiment, the second side 18 comprises one cooling area 20. The cooling area 20 is adapted for dissipating heat from the baseplate 10 by bringing the cooling area 20 into contact with a coolant flow 24 in a cooling channel 26, wherein the cooling channel 26 is not shown in FIG. 2, but in FIG. 3. Adjacent to the cooling area 20 the auxiliary area 22 is located. FIG. 2 shows that the auxiliary area 22 comprises a flow guide 28. The flow guide 28 is adapted for reducing a flow rate of the coolant flow 24 at the auxiliary area 22.

FIG. 2 also shows that the cooling area 20 comprises a cooling structure 30, which is adapted for being placed in the cooling channel 26 and being flown through by the coolant flow 24. In this second embodiment, the cooling structure 30 comprises a plurality of cooling pins 32. The cooling pins 32 protrude in a perpendicular manner from the second side 18 of the baseplate 10.

The flow guide 28 as well as the cooling structure 30 may be understood as being part of the baseplate 10.

In the second embodiment of the invention in FIG. 2, the flow guide 28 is formed by a rim 34, which is arranged corresponding to the contour of the auxiliary area 22. The flow guide 28 comprises an essentially rectangular shaped form. The edges of the rectangular shaped rim 34 are rounded. The height of the flow guide 28 and therefore the height of the rim 34 corresponds to the height of the cooling structure 30 and therefore to the height of the cooling pins 32. The flow guide 28 is hollow at its inside. Hence, only little material is used for the production of the flow guide 28.

A longer axis 36 of the rectangular shaped form of the flow guide 28 is parallel to the flow direction of the coolant flow 24.

Figure 3:
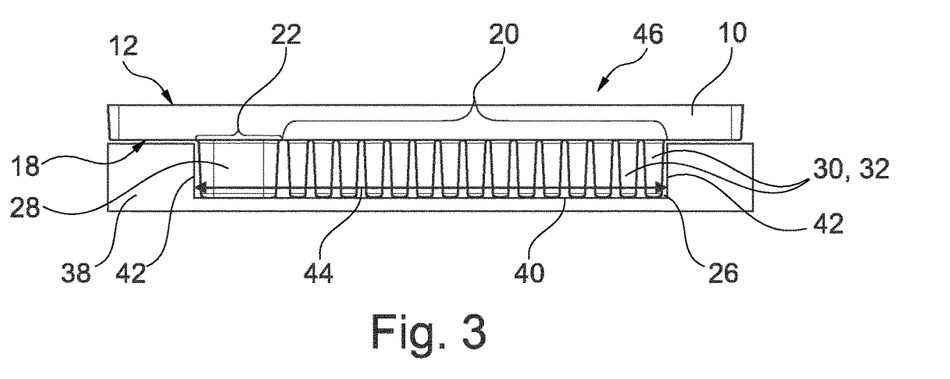
FIG. 3 shows a cross sectional view of an arrangement of the baseplate of FIG. 2 and a cooler according to the invention.

FIG. 3 shows an arrangement 46 of the baseplate 10 of FIG. 2 and a cooler 38. The cooler 38 comprises the cooling channel 26 which is adapted for providing the coolant flow 24. The cooling channel 26 has a flat bottom 40 and two side walls 42 that are essentially perpendicular to the bottom 40. The shortest distance between the two side walls 42 of the cooling channel 26 defines the width 44 of the cooling channel 26.

The cooling channel 26 of the cooler 38 is adapted for receiving the cooling structure 30 and the at least one flow guide 28.

As can be seen on FIGS. 2 and 3, the auxiliary area 22 and the cooling area 20 together have a width which corresponds to the width 44 of the cooling channel 26. The auxiliary area 22 and the cooling area 20 are arranged along the width 44 of the cooling channel 26. Therefore, the coolant flow 24 through the cooling area 22 may not be obstructed by the flow guide 28. Hence a highly efficient and homogenous cooling of the device 14 is achieved. Furthermore, the cooling structure 30 and the flow guide 28 are in mechanical contact with the bottom 40 of the cooling channel 26. This effectively prevents a by-pass flow of the coolant between the bottom 40 of the cooling channel 26 and the cooling structure 30 or the flow guide 28, respectively.

Figure 4:
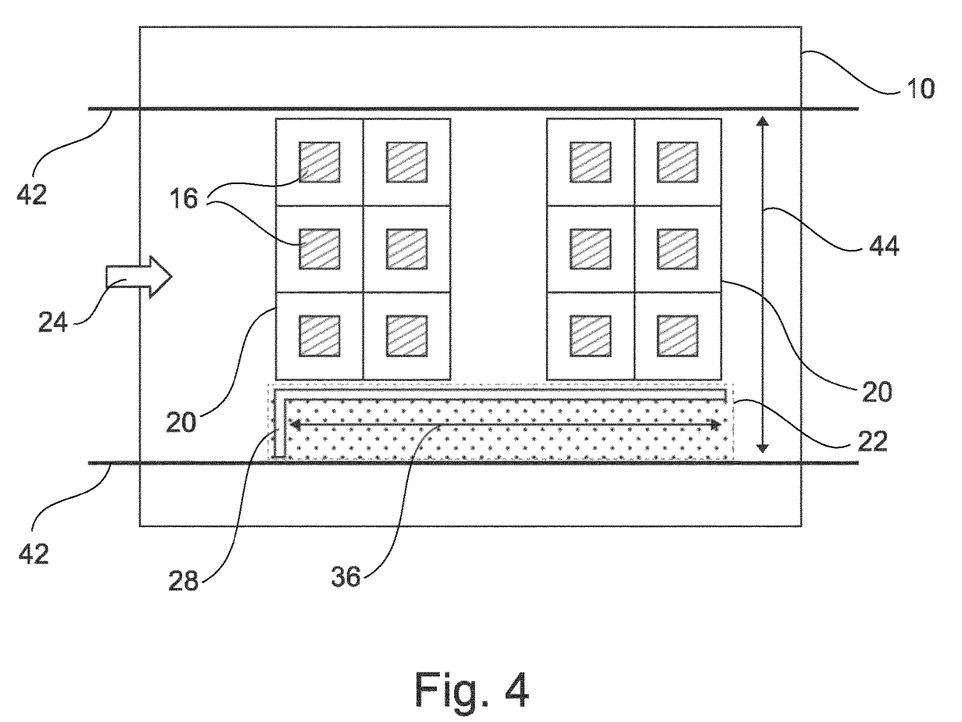
FIG. 4 shows a schematic view of a further arrangement of a baseplate and of a cooler according to a further embodiment of the invention.

FIG. 4 shows an arrangement of the baseplate 10 and the cooler 38. The view is from the top, therefore only the side walls 42 of the cooler 38 are visible in FIG. 4. The baseplate 10 is adapted to carry twelve power semiconductor devices 14. The twelve power semiconductor devices 14 are arranged in such a way on the first side 12 of the baseplate 10 that on the second side 18 of the baseplate there are twelve cooling areas 20, wherein each cooling area 20 corresponds to one device area 16. However, as the twelve cooling areas 20 are arranged in two groups of six cooling areas 20 each, and wherein each group of six cooling areas 20 forms one continuous area, it is also possible to state, that the second side 18 comprises two cooling areas 20. Furthermore, the second side 18 comprises the flow guide 28 in the auxiliary area 22. In this embodiment, the flow guide 28 has an L-shaped form. The longer axis 36 of the L-shaped form of the flow guide 28 is parallel to the flow direction of the coolant flow 24.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An apparatus comprising:
a baseplate having a first side and a second side opposite the first side;
a cooler providing a cooling channel adapted for providing a coolant flow;
an electronic circuit that comprises a power semiconductor device disposed at the first side of the baseplate, wherein a footprint of the power semiconductor device defines a device area on the first side;
a cooling area at the second side of the baseplate opposite the device area, wherein the cooling area is adapted for dissipating heat from the baseplate by bringing the cooling area into thermal contact with the coolant flow in the cooling channel; and
an auxiliary area located at the second side of the baseplate adjacent to the cooling area, wherein the auxiliary area comprises a flow guide for reducing a flow rate of the coolant flow in the auxiliary area, wherein the cooling channel is adapted to receive the cooling area and the flow guide, and wherein the flow guide comprises a hollow rectangular rim structure surrounding an open area.

2. The apparatus according to claim 1, wherein the cooling area comprises a cooling structure disposed in the cooling channel, the cooling structure configured so that the coolant flow can flow through the cooling structure.

3. The apparatus according to claim 2, wherein a height of the flow guide corresponds to a height of the cooling structure.

4. The apparatus according to claim 2, wherein the cooling structure comprises a plurality of cooling pins.

5. The apparatus according to claim 1, wherein the size of the cooling area essentially corresponds to the size of the device area.

6. The apparatus according to claim 1, wherein the flow guide comprises a contour that is arranged corresponding to a contour of the auxiliary area.

7. The apparatus according to claim 1, wherein a longer axis of the flow guide is parallel to a flow direction of the coolant flow.

8. The apparatus according to claim 1, wherein the flow guide is fixed to a main body of the baseplate by brazing, welding or gluing.

9. The apparatus according to claim 1, wherein the auxiliary area and the cooling area together have a width that corresponds to the width of the cooling channel.

10. The apparatus according to claim 1, wherein the auxiliary area and the cooling area are arranged along the width of the cooling channel.

11. The apparatus according to claim 1, wherein the cooling area comprises a cooling structure, the cooling structure and the flow guide being in mechanical contact with a bottom of the cooling channel.

12. An apparatus comprising:
a baseplate having a first side and a second side opposite the first side;
an electronic circuit disposed at the first side of the baseplate, the electronic circuit comprising at least one power semiconductor device; and
a cooler that provides a cooling channel formed by a space of the cooler that is open to one side, wherein the side of the cooler that is open end of the space is sealed to the second side of the baseplate,
wherein the cooling channel adapted for providing a coolant flow,
wherein the cooler comprises a cooling structure disposed in the cooling channel,
wherein the at least one power semiconductor device forms at least one device area on the first side, the device area being the footprint of the power semiconductor device, wherein the baseplate comprises, on the second side, at least one cooling area opposite to at least one device area, wherein the at least one cooling area is adapted for dissipating heat from the baseplate by bringing the cooling area into contact with the coolant flow in the cooling channel, wherein the baseplate on the second side additionally comprises an auxiliary area located adjacent to the cooling area, wherein the auxiliary area comprises a flow guide for reducing a flow rate of the coolant flow in the auxiliary area, and wherein the cooling channel is adapted for receiving the at least one cooling area and the flow guide.

13. The apparatus according to claim 12, wherein the flow guide comprises a closed rectangular rim structure.

14. The apparatus according to claim 12, wherein the cooler is sealed to second side by way of a braze, a weld, or a glue.

15. The apparatus according to claim 12, wherein a height of the flow guide corresponds to a height of the cooling structure.

16. The apparatus according to claim 12, wherein the cooling structure comprises a plurality of cooling pins.

17. An apparatus comprising:
a baseplate having a first side and a second side opposite the first side;
a plurality of power semiconductor devices disposed at the first side of the baseplate, wherein a footprint of each power semiconductor device defines a corresponding device area on the first side;
a cooler providing a cooling channel adapted for providing a coolant flow;
a plurality of cooling areas at the second side of the baseplate opposite the device area, wherein each cooling area is adapted for dissipating heat from the baseplate by bringing the cooling area into thermal contact with the coolant flow in the cooling channel;
a plurality of cooling structures disposed within the cooling channel, each cooling structure located between the baseplate and a corresponding one of the cooling areas; and
an auxiliary area disposed within the cooling channel along a wall of the cooling channel and adjacent ones of the cooling areas, the auxiliary area located between the wall of the cooling channel and the semiconductor devices, wherein the auxiliary area comprises a flow guide that has an L-shaped form with a long leg and a short leg, the short leg extending away from the wall of the cooling channel and the long leg spaced from the wall of the cooling channel by the short leg and being adjacent the ones of the cooling areas.

18. The apparatus according to claim 17, wherein the cooling structure comprises a plurality of cooling pins.

19. The apparatus according to claim 17, wherein the semiconductor power devices are arranged in a plurality of rows, each row extending away from the flow guide.

20. The apparatus according to claim 17, wherein the size of each cooling area essentially corresponds to the size of the corresponding device area.

* * * * *